United States Patent
Lee et al.

(10) Patent No.: US 8,654,543 B2
(45) Date of Patent: Feb. 18, 2014

(54) CIRCUIT BOARD ASSEMBLY

(75) Inventors: Hsiang-Chao Lee, Taoyuan County (TW); Yun-Chih Chen, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 478 days.

(21) Appl. No.: 13/088,759

(22) Filed: Apr. 18, 2011

(65) Prior Publication Data
US 2012/0195017 A1  Aug. 2, 2012

(30) Foreign Application Priority Data
Jan. 28, 2011 (TW) .............................. 100202072 U

(51) Int. Cl.
*H01R 12/16* (2006.01)

(52) U.S. Cl.
USPC ........... 361/790; 361/763; 361/766; 361/792; 361/794; 361/795

(58) Field of Classification Search
USPC ................... 361/763–766, 790–795, 803; 257/685–686
See application file for complete search history.

(56) References Cited

U.S. PATENT DOCUMENTS

| | | | |
|---|---|---|---|
| 7,488,895 B2 * | 2/2009 | Hayashi et al. | 174/255 |
| 2008/0067656 A1 | 3/2008 | Leung et al. | |
| 2010/0103635 A1 * | 4/2010 | Tuominen et al. | 361/764 |

FOREIGN PATENT DOCUMENTS

TW  545100  8/2003

* cited by examiner

*Primary Examiner* — Tuan T Dinh
(74) *Attorney, Agent, or Firm* — Muncy, Geissler, Olds & Lowe, PLLC

(57) ABSTRACT

A circuit board assembly includes two external circuit boards, at least one electrical connector, at least one electronic component, and at least one hollow substrate. Each external circuit board includes an external electromagnetic shielding layer, a circuit layer and a dielectric layer. In each external circuit board, the dielectric layer is located between the external electromagnetic shielding layer and the circuit layer. The electrical connector is connected between the circuit layers located between the external electromagnetic shielding layers. The electronic component is disposed between the external circuit boards and connected with one of the circuit layers. The hollow substrate with plural openings is disposed between the external circuit boards. The electronic component and the electrical connector are located in the openings. Both a thickness of the electronic component and a height of the electrical connector are smaller than or equal to a thickness of the hollow substrate.

14 Claims, 3 Drawing Sheets

CIRCUIT BOARD ASSEMBLY

CROSS-REFERENCE TO RELATED APPLICATION

This application claims the benefit of Taiwan Patent Application No. 100202072, filed on Jan. 28, 2011, which is hereby incorporated by reference for all purposes as if fully set forth herein.

BACKGROUND OF THE INVENTION

1. Field of Invention

The present invention relates to a circuit board assembly, and more particularly to a circuit board assembly with an electromagnetic shielding function.

2. Related Art

A circuit board assembly is an electronic assembly which is formed by combining a circuit board and at least one electronic component. The electronic component may be an active component or a passive component. The active component is such as a transistor or a chip, and the passive component is such as a capacitor, an inductor, or a resistor.

In a current common circuit board assembly, in order to increase the number of the electronic components mounted on the circuit board, a large number of electronic components are usually respectively mounted on two opposite planes of the circuit board, and a distance between two adjacent electronic components which are located on the same plane is shortened to the greatest extent, so that a distribution density and the number of the electronic components in the circuit board assembly are increased.

However, since the distance between the two adjacent electronic components is shortened, the circuit board assembly may easily make a problem of electromagnetic interference (EMI) happen when electrifying the circuit board assembly, and thus it will cause a bad effect to the operating electronic components. Besides, some kinds of electronic components have a low electromagnetic susceptibility (EMS) and thus may easily be jammed by external electromagnetic waves. Therefore, it also will cause a bad effect to the operating electronic components.

SUMMARY OF THE INVENTION

The present invention is directed to a circuit board assembly which may reduce the bad effect of the EMI to the electronic components and enhance the EMS.

The present invention provides a circuit board assembly comprising two external circuit boards, at least one electrical connector, at least one electronic component, and at least one hollow substrate. Each external circuit board comprises an external electromagnetic shielding layer, a circuit layer, and a dielectric layer. In each external circuit board, the dielectric layer is located between the external electromagnetic shielding layer and the circuit layer. The circuit layers are located between the external electromagnetic shielding layers. The electrical connector is connected between the circuit layers. The electronic component is disposed between the external circuit boards and connected with one of the circuit layers. The hollow substrate is disposed between the external circuit boards and having a plurality of openings. The electronic component and the electrical connector are located in the openings. Both a thickness of the electronic component and a height of the electrical connector are smaller than or equal to a thickness of the hollow substrate.

Based on the above description, the circuit board assembly in the present invention not only can shield external electromagnetic waves to enhance the EMS of the electronic components in the circuit board assembly, but also can reduce the bad effect of the EMI to the electronic components through the hollow substrates and external electromagnetic shielding layers of external circuit boards, To make the features and advantages of the present invention more clear and understandable, the present invention will be described below in great detail through the embodiments in combination with the accompanying drawings.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
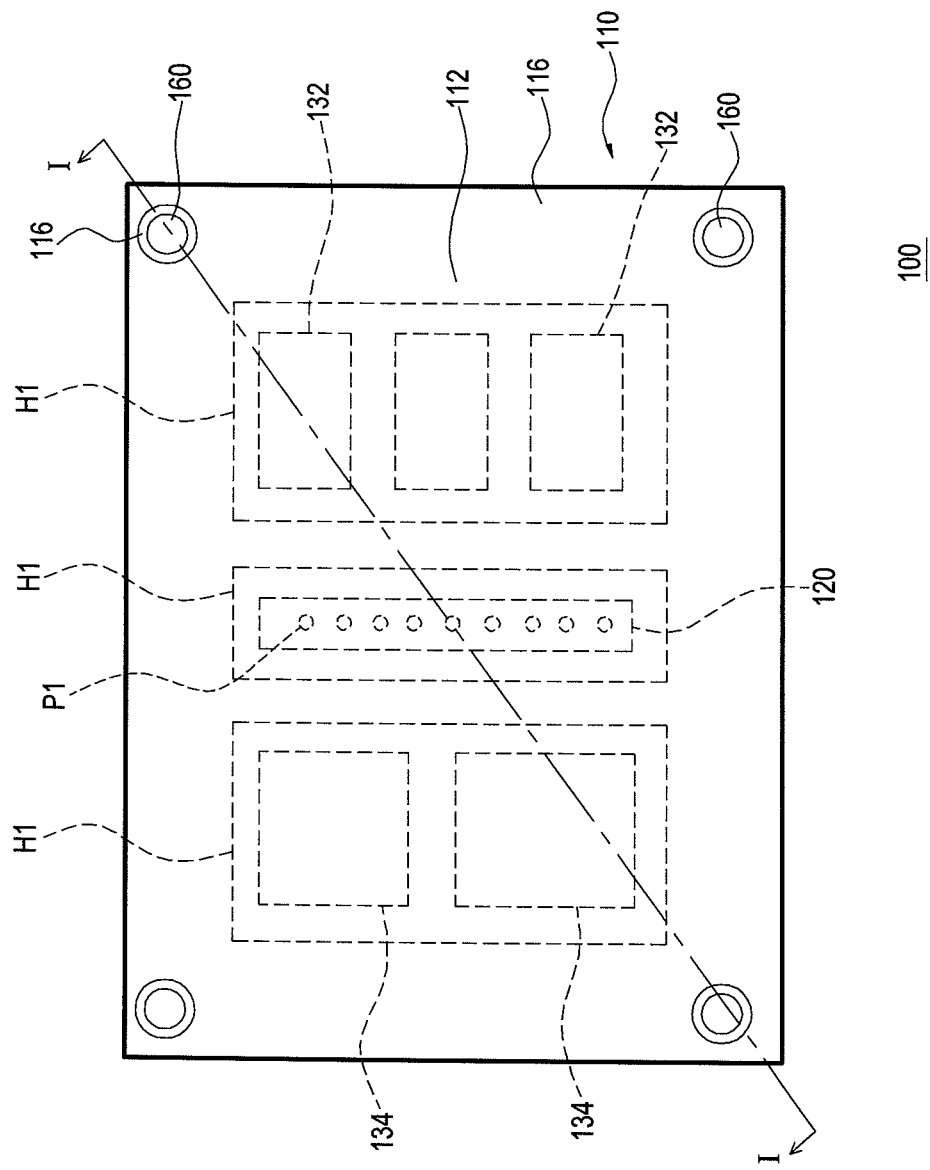
FIG. 1A is a schematic top view of a circuit board assembly according to an embodiment of the present invention.
Figure 1B:
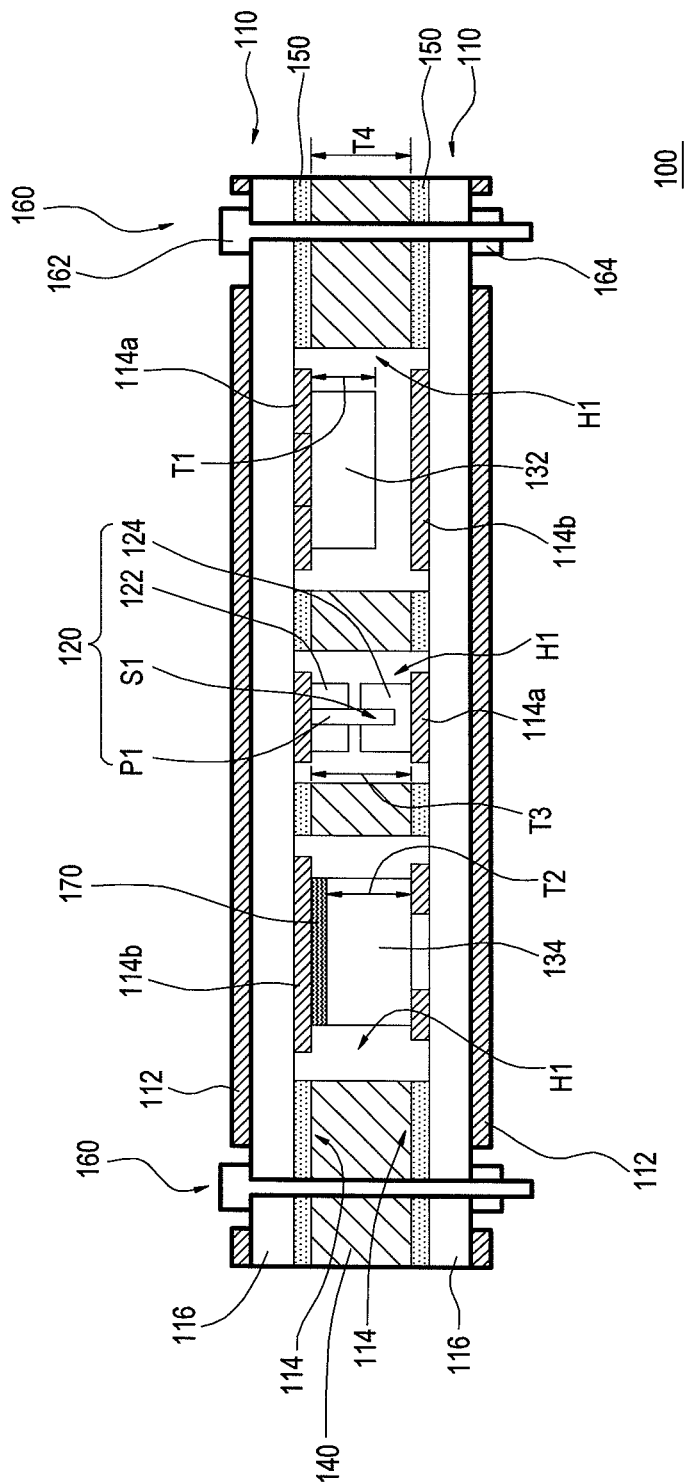
FIG. 1B is a schematic cross sectional view of FIG. 1A along the line I-I.

FIG. 1A is a schematic top view of a circuit board assembly according to an embodiment of the present invention, and FIG. 1B is a schematic cross sectional view of FIG. 1A along the line I-I. Referring to FIG. 1A and FIG. 1B, the circuit board assembly 100 of this embodiment includes two external circuit boards 110, at least one electrical connector 120, a plurality of electronic components 132 and 134, and a hollow substrate 140. The hollow substrate 140 is disposed between the external circuit boards 110.

A material of the hollow substrate 140 may be metal, that is, the hollow substrate 140 may be a hollow metal plate and has a plurality of openings H1. The electronic components 132 and 134 and the electrical connector 120 are located in the openings H1. A thickness T1 of the electronic component 132, a thickness T2 of the electronic component 134, and a height T3 of the electrical connector 120 are all smaller than or equal to a thickness T4 of the hollow substrate 140. Therefore, the electronic components 132, 134 and the electrical connector 120 do not protrude from a surface of the hollow substrate 140.

In this embodiment, the electronic components 132 and 134 may be active components or passive components. For example, the electronic component 132 or 134 may be a transistor, a chip, a capacitor, an inductor, or a resistor. In addition, the electronic component 132 or 134 may also be an analog component, a digital component, a low-frequency component, a high-frequency component, or a power component.

It is necessary to note that although FIG. 1A and FIG. 1B show a plurality of electronic components 132 and 134, the circuit board assembly 100 may also include only one electronic component according to different product designs of the circuit board assembly 100, that is, the circuit board assembly 100 may include only one electronic component 132 or 134. Therefore, the number of the electronic components (that is, the electronic components 132 and 134) shown in FIG. 1A and FIG. 1B is only taken for an example and does not limit the present invention.

Each external circuit board 110 includes an external electromagnetic shielding layer 112, a circuit layer 114, and a dielectric layer 116. In each external circuit board 110, the dielectric layer 116 is located between the external electromagnetic shielding layer 112 and the circuit layer 114. The circuit layers 114 are located between the external electromagnetic shielding layers 112. Materials of both the external electromagnetic shielding layer 112 and the circuit layer 114 may be metal materials, such as copper or aluminum. The external electromagnetic shielding layer 112 and the circuit layer 114 may be formed of two metal foils after lithography and etching.

The electrical connector 120 and the electronic components 132 and 134 are all disposed between the external circuit boards 110 and are sandwiched between the external circuit boards 110. The electrical connector 120 is connected between the circuit layers 114. The electronic component 132 is connected with one of the circuit layers 114, and the electronic component 134 is connected with the other circuit layer 114. Taking FIG. 1B as an example, each circuit layer 114 includes a signal wiring layer 114a and an internal electromagnetic shielding layer 114b. The electronic component 132 is connected with an upper signal wiring layer 114a, the electronic component 134 is connected with a lower signal wiring layer 114a, and the electrical connector 120 is connected with the signal wiring layers 114a.

The electronic component 132 may be located between the upper signal wiring layer 114a and a lower internal electromagnetic shielding layer 114b, and the electronic component 134 may be located between the lower signal wiring layer 114a and an upper internal electromagnetic shielding layer 114b. The signal wiring layers 114a basically will not be electrically conducted with the internal electromagnetic shielding layers 114b and the external electromagnetic shielding layers 112. Furthermore, both the internal electromagnetic shielding layers 114b and the external electromagnetic shielding layers 112 may be grounded.

Thus it can be seen that the internal electromagnetic shielding layers 114b can provide an electromagnetic shielding function for the electronic components 132 and 134, so as to reduce the bad effect of the EMI to the electronic components 132 and 134. In addition, since the hollow substrate 140 may be a hollow metal plate, the hollow substrate 140 can shield electromagnetic waves emitted from the electronic components 132 and 134, thereby further effectively reducing the bad effect of the EMI to the electronic components 132 and 134.

The electrical connector 120 may include a male connector 122 and a female connector 124. The male connector 122 is connected with the signal wiring layer 114a of one of the circuit layers 114, and the female connector 124 is connected with the signal wiring layer 114a of the other circuit layer 114. The male connector 122 has a plurality of probes P1, and the female connector 124 has a plurality of sockets S1. The probes P1 may be respectively inserted into the sockets S1. Therefore, through the probes P1 and the sockets S1, the male connector 122 and the female connector 124 not only can be combined together, but also can be electrically connected with each other, thereby generating the electrical connection between the external circuit boards 110.

In this embodiment, the circuit board assembly 100 may further include a plurality of adhesive materials 150, and each adhesive material 150 is adhered between the hollow substrate 140 and one of the external circuit boards 110. Therefore, through the adhesive materials 150, the hollow substrate 140 is able to be adhered between the external circuit boards 110, thereby enabling the external circuit boards 110 to be fixed on two opposite sides of the hollow substrate 140.

The adhesive materials 150 may be water-proof adhesives. When the adhesive materials 150 are water-proof adhesives, since the electrical connector 120 and the electronic components 132 and 134 are all sandwiched between the external circuit boards 110, the adhesive materials 150 can seal the electrical connector 120 and the electronic components 132 and 134 between the external circuit boards 110, thereby isolating the electrical connector 120 and the electronic components 132, 134 from the outside environment. Therefore, it is difficult for external water vapor or liquid to permeate into the circuit board assembly 100, thereby protecting the electrical connector 120 and the electronic components 132 and 134.

In addition, the circuit board assembly 100 may further include one or more locking assemblies 160. Each locking assembly 160 includes a screw 162 and a nut 164. The screws 162 can penetrate the external circuit boards 110 and the hollow substrate 140, and can be locked with the nuts 164. By locking the screws 162 with the nuts 164, the external circuit boards 110 may also be fixed on the two opposite sides of the hollow substrate 140.

It is necessary to note that although FIG. 1B shows both the adhesive materials 150 and the locking assemblies 160, in other embodiment, the circuit board assembly 100 may include only one of the adhesive materials 150 and the locking assemblies 160. That is to say, the circuit board assembly 100 may only include the adhesive materials 150 without any locking assemblies 160, or the circuit board assembly 100 may only include the locking assemblies 160 without any adhesive materials 150. Therefore, the adhesive materials 150 and the locking assemblies 160 shown in FIG. 1A and FIG. 1B are only take for an example and do not limit the present invention.

The circuit board assembly 100 may further include at least one heat dissipation material 170. The heat dissipation material 170 may be a thermal adhesive, a thermal paste, or a thermal sheet and is disposed between the electronic component 134 and the internal electromagnetic shielding layer 114b adjacent to the electronic component 134. When the electronic component 132 is, for example, a power component which can generate a large amount of thermal energy, the heat dissipation material 170 can quickly transfer the thermal energy generated by the electronic component 132, thereby helping the electronic component 132 to dissipate the heat and to prevent the heat energy from accumulating in the electronic component 132. Therefore, the occurrence of the electronic component 132 overheating may be reduced, thereby preventing the electronic component 132 from failure or burning down.

Figure 2:
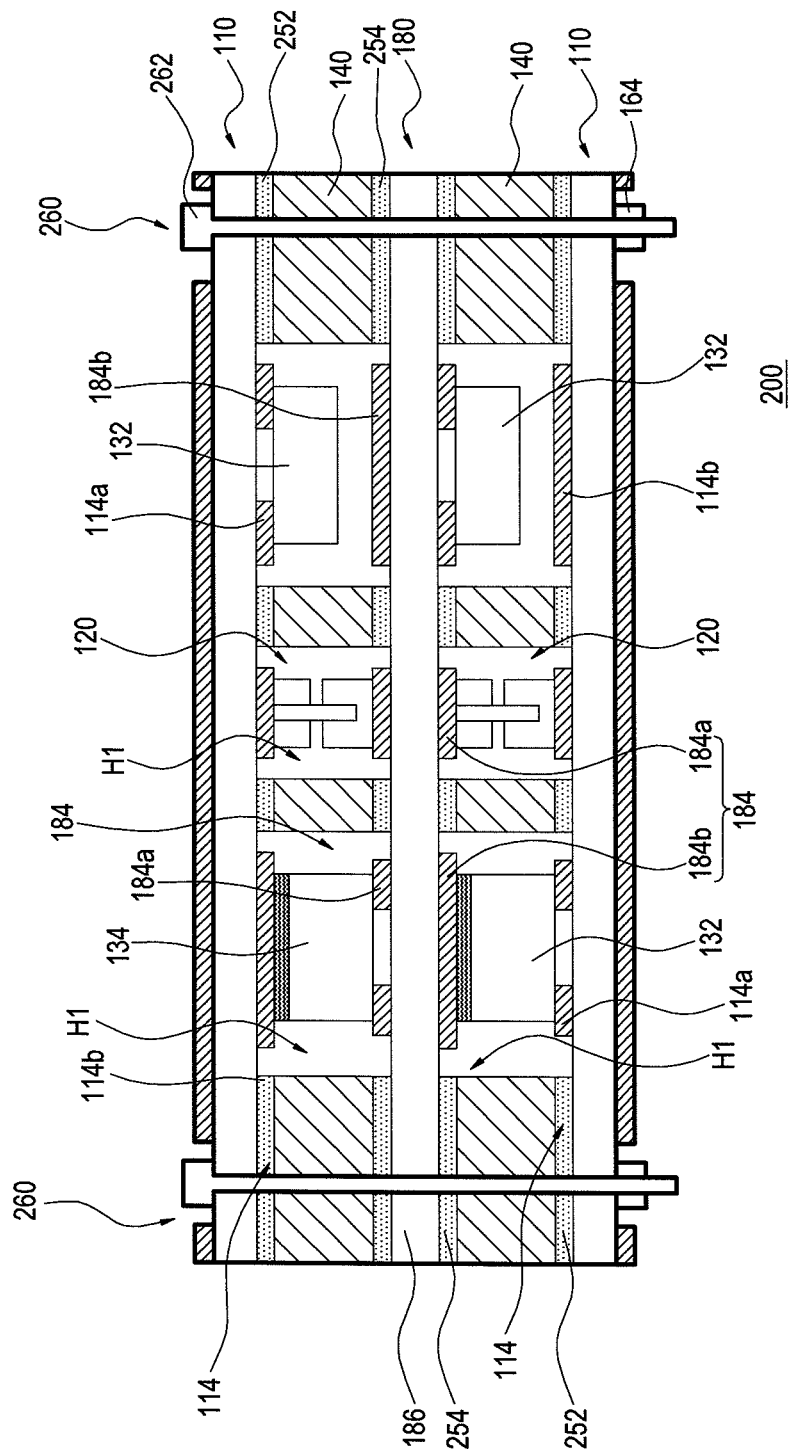
FIG. 2 is a schematic cross sectional view of a circuit board assembly according to another embodiment of the present invention.

FIG. 2 is a schematic cross sectional view of a circuit board assembly according to another embodiment of the present invention. Referring to FIG. 2, the circuit board assembly 200 in this embodiment is similar to the circuit board assembly 100 in the former embodiment. For example, both the circuit board assemblies 100 and 200 include some the same components. The differences lie in that, the circuit board assembly 200 not only includes a plurality of electrical connectors 120 and a plurality of hollow substrates 140, but also includes at least one internal circuit board 180. The differences between the circuit board assemblies 100 and 200 are mainly described hereinafter, and the same technical features between the circuit board assemblies 100 and 200 will not be introduced in detail.

The hollow substrates 140, the electronic components 132 and 134, the electrical connectors 120, and the internal circuit boards 180 are all disposed between the external circuit boards 110. Each hollow substrate 140 is disposed between the internal circuit board 180 and the circuit layer 114 of one of the external circuit boards 110, and thus the internal circuit board 180 is sandwiched between the hollow substrates 140. Each hollow substrate 140 has a plurality of openings H1. The electronic components 132 and 134 and the electrical connectors 120 are located in the openings H1.

The internal circuit board 180 includes an internal dielectric layer 186 and two internal circuit layers 184. The internal dielectric layer 186 is disposed between the internal circuit layers 184. Each internal circuit layer 184 is located between the internal dielectric layer 186 and one of the hollow substrates 140. At least one electronic component 132 or at least one electronic component 134 is electrically connected with one of the internal circuit layers 184.

Particularly, each internal circuit layer 184 includes a signal wiring layer 184a and an internal electromagnetic shielding layer 184b. It can be seen from FIG. 2 that one of the electronic components 132 is connected with a lower signal wiring layer 184a, and the electronic component 134 is connected with an upper signal wiring layer 184a. In addition, it can be seen from FIG. 2 that, two electronic components 132 respectively correspond to the internal electromagnetic shielding layers 184b. In the two electronic components 132, each electronic component 132 is located between one of the internal electromagnetic shielding layers 184b and one of the circuit layers 114.

Each hollow substrate 140 may be fixed between the internal circuit board 180 and the external circuit board 110 in a manner of adhering. Particularly, the circuit board assembly 200 may further include a plurality of first adhesive materials 252 and a plurality of second adhesive materials 254. Each first adhesive material 252 is adhered between one of the hollow substrates 140 and one of the external circuit boards 110, and each second adhesive material 254 is adhered between the internal circuit board 180 and one of the hollow substrates 140. Therefore, each hollow substrate 140 is able to be fixed between the internal circuit board 180 and the external circuit board 110.

Both the first adhesive materials 252 and the second adhesive materials 254 may be water-proof adhesives. When both the first adhesive materials 252 and the second adhesive materials 254 are water-proof adhesives, the first adhesive materials 252 and the second adhesive materials 254 can seal the electronic components 132 and 134 and the electrical connector 120 between the external circuit boards 110, thereby isolating the electronic components 132 and 134 and the electrical connector 120 from the outside environment. Therefore, it is difficult for external water vapor or liquid to permeate into the circuit board assembly 200 and thus to protect the electronic components 132 and 134.

The circuit board assembly 200 may further include one or more locking assemblies 260. Each locking assembly 260 includes a screw 262 and a nut 164. The screw 262 penetrates the external circuit boards 110, the hollow substrates 140, and the internal circuit boards 180. Since the circuit board assembly 200 further includes an extra internal circuit board 180 compared with the circuit board assembly 100, the overall thickness of the circuit board assembly 200 is basically larger than the overall thickness of the circuit board assembly 100. Therefore, the length of the screw 262 is larger than that the length of the screw 162 in FIG. 1B. The screw 262 can be locked with the nut 164. After the screw 262 is locked with the nut 164, each hollow substrate 140 can be fixed between the internal circuit board 180 and the external circuit board 110.

Although FIG. 2 shows both the first adhesive materials 252 and the second adhesive materials 254 and the locking assemblies 260, in other embodiment, the circuit board assembly 200 may only include the adhesive materials (that is, the first adhesive materials 252 and the second adhesive materials 254) or the locking assemblies 260. That is to say, the circuit board assembly 200 may only include the first adhesive materials 252 and the second adhesive materials 254 without any locking assemblies 260, or the circuit board assembly 200 may only include the locking assemblies 260 without any first adhesive materials 252 and any second adhesive materials 254. Therefore, the first adhesive materials 252, the second adhesive materials 254, and the locking assemblies 260 shown in FIG. 2 are only taken for an example and do not limit the present invention.

Based on the above description, the external circuit boards sandwiching the electronic components and the electrical connectors have external electromagnetic shielding layers, so that the external electromagnetic shielding layers can shield electromagnetic waves emitted from the outside environment, thereby reducing the bad effect of the external electromagnetic wave to the electronic components and enhancing the EMS of the electronic components in the circuit board assembly.

Furthermore, in the circuit board assembly of the present invention, both the external circuit boards and the internal circuit boards have the internal electromagnetic shielding layers, and the hollow substrates may be the hollow metal plates, so the hollow substrates and the internal electromagnetic shielding layers can shield the electromagnetic waves generated by the electronic components. Thus it can be seen that the present invention not only can reduce the bad effect of the EMI to the electronic components, but also can enhance the EMS, thereby prompting the smooth operation of the electronic components in the circuit board assembly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:
1. A circuit board assembly, comprising:
two external circuit boards, wherein each external circuit board comprises an external electromagnetic shielding layer, a circuit layer, and a dielectric layer, in each external circuit board, the dielectric layer is located between the external electromagnetic shielding layer and the circuit layer, and the circuit layers are located between the external electromagnetic shielding layers;
at least one electrical connector, connected between the circuit layers;
at least one electronic component, disposed between the external circuit boards and connected with one of the circuit layers; and
at least one hollow substrate, disposed between the external circuit boards and having a plurality of openings, wherein the electronic component and the electrical connector are located in the openings, and both a thickness of the electronic component and a height of the electrical connector are smaller than or equal to a thickness of the hollow substrate.
2. The circuit board assembly according to claim 1, wherein the electrical connector comprises:
a male connector, having a plurality of probes and connected with one of the circuit layers; and a female connector, having a plurality of sockets and connected with an other circuit layer, wherein the probes are respectively inserted into the sockets.

3. The circuit board assembly according to claim 1, wherein the hollow substrate is a hollow metal plate.

4. The circuit board assembly according to claim 1, wherein each circuit layer comprises a signal wiring layer and an internal electromagnetic shielding layer, the electronic component is connected with the signal wiring layer and is located between the signal wiring layer and one of the internal electromagnetic shielding layers.

5. The circuit board assembly according to claim 4, further comprising at least one heat dissipation material disposed between the electronic component and the internal electromagnetic shielding layer.

6. The circuit board assembly according to claim 1, further comprising a plurality of adhesive materials each adhered between the hollow substrate and one of the external circuit boards.

7. The circuit board assembly according to claim 6, wherein the adhesive material is a water-proof adhesive.

8. The circuit board assembly according to claim 1, further comprising at least one internal circuit board, wherein a plurality of electronic components, a plurality of electrical connectors and a plurality of hollow substrates exist, the hollow substrates, the electronic components, and the electrical connectors are all disposed between the external circuit boards, each hollow substrate is disposed between the internal circuit board and one of the circuit layers, each hollow substrate has the openings, and the electronic components and the electrical connectors are located in the openings.

9. The circuit board assembly according to claim 8, wherein the internal circuit board comprises:

two internal circuit layers, wherein at least one of the electronic components is electrically connected with one of the internal circuit layers; and an internal dielectric layer, disposed between the internal circuit layers, wherein each internal circuit layer is located between the internal dielectric layer and one of the hollow substrates.

10. The circuit board assembly according to claim 9, wherein each internal circuit layer comprises a signal wiring layer and an internal electromagnetic shielding layer, and the electronic component is connected with the signal wiring layer.

11. The circuit board assembly according to claim 10, wherein an other electronic component is located between the internal electromagnetic shielding layer and the circuit layer.

12. The circuit board assembly according to claim 9, further comprising a plurality of first adhesive materials and a plurality of second adhesive materials, wherein each first adhesive material is adhered between one of the hollow substrates and one of the external circuit boards, and each second adhesive material is adhered between the internal circuit board and one of the hollow substrates.

13. The circuit board assembly according to claim 12, wherein both the first adhesive materials and the second adhesive materials are water-proof adhesives.

14. The circuit board assembly according to claim 1, further comprising at least one locking assembly, wherein the locking assembly comprises a screw and a nut, and the screw penetrates the external circuit boards and the hollow substrate, and the screw is locked with the nut.

* * * * *